United States Patent [19]

Op de Beek et al.

[11] Patent Number: 4,845,758
[45] Date of Patent: Jul. 4, 1989

[54] EQUALIZER WITH ADJUSTABLE BAND FILTERS AND A DIGITAL FILTER SUITABLE FOR USE IN THE EQUALIZER

[75] Inventors: Franciscus J. Op de Beek; Johan M. Rijnsburger; Jacob M. van Nieuwland; Johannes W. Kemna, all of Eindhoven, Netherlands

[73] Assignee: U.S. Philips Corp., New York, N.Y.

[21] Appl. No.: 878,933

[22] Filed: Jun. 26, 1986

[30] Foreign Application Priority Data

Jun. 26, 1985 [NL] Netherlands ............... 8501834

[51] Int. Cl.$^4$ .............................. H03G 5/00
[52] U.S. Cl. ...................... 381/98; 381/103; 333/28 T
[58] Field of Search ............ 333/28 T, 303, 165, 333/166, 167; 381/98, 103

[56] References Cited

U.S. PATENT DOCUMENTS

| | | | |
|---|---|---|---|
| 4,206,417 | 6/1980 | Poulo | 330/303 |
| 4,271,398 | 6/1981 | Higashi et al. | 333/28 T |
| 4,484,345 | 11/1984 | Stearns | 381/98 |
| 4,628,530 | 12/1986 | Op de Beek et al. | 381/103 |
| 4,633,501 | 12/1986 | Werrbach | 333/28 T |

FOREIGN PATENT DOCUMENTS

2068678 12/1981 United Kingdom.

*Primary Examiner*—Forester W. Isen
*Attorney, Agent, or Firm*—Bernard Franzblau

[57] ABSTRACT

A manually operated or automatic equalizer (1) with adjustable band filters for varying the frequency characteristic of an electric signal presented to an input (2) and for applying a frequency characteristic-adapted electric signal to an output (3). The equalizer has a plurality of band filters ($F_1$ to $F_n$) with their bands located adjacent to one another in a given frequency range. The distance (frequency separation) between the central frequencies of filters having neighboring bands is greater than the distance between the central frequencies of one third octave filters having neighboring bands located at at least approximately the same frequencies as those of the band filters ($F_i$). At least those band filters ($F_1$ to $F_m$) whose bands are located in the low-frequency part (f<450 Hz) of the frequency range have a central frequency ($fc_i$) which is variable. A digital filter which can be used as a band filter in the equalizer is also described.

13 Claims, 10 Drawing Sheets

| i | $fc_i^I$ (Hz) | $fc_i$ (Hz) | $fc_i^{II}$ (Hz) |
|---|---|---|---|
| 1 | 25 | 31,5 | 40 |
| 2 | 50 | 63 | 80 |
| 3 | 100 | 125 | 160 |
| 4 | 200 | 250 | 315 |
| 5 | 400 | 500 | 630 |

| | fc$_i$ = 25 Hz | | | | |
|---|---|---|---|---|---|
| A(dB) | a$_1$ | a$_2$ | b$_1$ | b$_2$ | k |
| 12 | 2046 | 2047 | 7 | 7 | 1297 |
| 10 | 2046 | 2047 | 7 | 7 | 941 |
| 8 | 2046 | 2047 | 7 | 7 | 658 |
| 6 | 2046 | 2046 | 7 | 7 | 579 |
| 4 | 2046 | 2046 | 7 | 7 | 340 |
| 2 | 2045 | 2046 | 7 | 7 | 180 |
| 0 | 2045 | 2046 | 7 | 7 | 0 |
| -2 | 2045 | 2045 | 6 | 7 | -210 |
| -4 | 2045 | 2045 | 6 | 7 | -376 |
| -6 | 2044 | 2045 | 6 | 7 | -594 |
| -8 | 2044 | 2044 | 6 | 6 | -819 |
| -10 | 2043 | 2044 | 5 | 6 | -1257 |
| -12 | 2043 | 2043 | 5 | 6 | -1530 |

| $fc_i = 31,5 Hz$ ||||||
|---|---|---|---|---|---|
| A (dB) | $a_1$ | $a_2$ | $b_1$ | $b_2$ | k |
| 12 | 2046 | 2047 | 9 | 9 | 1004 |
| 10 | 2046 | 2046 | 9 | 9 | 974 |
| 8 | 2046 | 2046 | 9 | 9 | 681 |
| 6 | 2045 | 2046 | 9 | 9 | 562 |
| 4 | 2045 | 2046 | 9 | 9 | 330 |
| 2 | 2045 | 2045 | 8 | 9 | 197 |
| 0 | 2044 | 2045 | 8 | 9 | 0 |
| -2 | 2044 | 2045 | 8 | 9 | -183 |
| -4 | 2044 | 2044 | 8 | 9 | -376 |
| -6 | 2043 | 2044 | 8 | 8 | -572 |
| -8 | 2043 | 2043 | 7 | 8 | -877 |
| -10 | 2042 | 2042 | 7 | 7 | -1196 |
| -12 | 2041 | 2042 | 6 | 7 | -1656 |

FIG. 5b

| $f_{c_i} = 40.0$ Hz ||||||
|---|---|---|---|---|---|
| A (dB) | $a_1$ | $a_2$ | $b_1$ | $b_2$ | k |
| 12 | 2046 | 2046 | 11 | 12 | 1092 |
| 10 | 2045 | 2046 | 11 | 12 | 993 |
| 8 | 2045 | 2046 | 11 | 12 | 694 |
| 6 | 2045 | 2045 | 11 | 12 | 550 |
| 4 | 2044 | 2045 | 11 | 11 | 378 |
| 2 | 2044 | 2045 | 11 | 11 | 167 |
| 0 | 2044 | 2044 | 11 | 11 | 0 |
| -2 | 2043 | 2044 | 10 | 11 | -188 |
| -4 | 2043 | 2043 | 10 | 11 | -375 |
| -6 | 2042 | 2042 | 10 | 10 | -610 |
| -8 | 2041 | 2042 | 9 | 10 | -886 |
| -10 | 2040 | 2041 | 9 | 9 | -1162 |
| -12 | 2040 | 2040 | 8 | 9 | -1527 | a b

EQUALIZER WITH ADJUSTABLE BAND FILTERS AND A DIGITAL FILTER SUITABLE FOR USE IN THE EQUALIZER

This invention relates to an equaliser for varying the frequency characteristic of an electric signal presented to an input of the equaliser and for applying a frequency characteristic-adapted electric signal to an output, said equaliser comprising a plurality of band filters with their bands adjacent to one another in a given frequency range, the distance between the central frequencies of filters having neighbouring bands being greater than the distance between the central frequencies of one third octave filters having neighbouring bands located at at least substantially the same frequencies as those of the band filters. The invention also relates to a band filter suitable for use in the equaliser.

Equalisers of the type specified above are known from British Patent Application No. GB 2,068,678A laid open to public inspection. Such an equaliser may be built up from, for example, a number of parallel arranged bandpass filters whose central frequencies are one octave apart. In this case each filter provides a substantially complete suppression outside the relevant band. Another possibility is for the equiliser to be built up from a number of series-arranged band filters. In the latter case each filter passes the signal unchanged outside the relevant band, that is to say, the gain is equal to fx. Within the relevant band the filter can amplify and then it functions as a bandpass filter, or attenuate and then it functions as a bandstop filter.

If the transmission of an audio system in a space, i.e. the conversion of an electric audio signal into an acoustic signal in the space is to be equalised (manually or automatically) by means of such an equiliser, that is to say, if the frequency characteristic of the acoustic signal in the space is to be (substantially) flat again, it is found that this is by no means feasible in all cases. The result is a poorly adjusted transmission which gives rise to distortion and an unnatural sound.

It is an object of the invention to provide an equaliser with which it is possible to realise a satisfactory equalisation using filters whose central frequencies are fairly far apart, that is to say, filters in which the distance between the central frequencies of neighbouring filters is larger than one third octave, thus, for example, one octave wide.

To this end the equaliser according to the invention is characterised in that the central frequencies of at least those band filters whose bands are located in the low-frequency part of the frequency range are variable.

The invention is based on the recognition that in the case of equalisation using band filters whose central frequencies are fairly far apart, particularly at low frequencies, the location of these bands does not correspond to the location of peaks and dips in the frequency characteristic which is to be corrected. In fact, the location of these peaks and dips along the frequency axis is dependent on, inter alia, the position in the space of a loudspeaker box by means of which the acoustic signal is radiated into this space, and on the space and size of the space.

Experiments by, inter alia, R. V. Waterhouse, see J.A.S.A. 1958, Vol. 30, no. 1, show that the width of these peaks and dips is approximately equal to the width of one octave. This width varies slightly, depending on whether the box is positioned in the neighbourhood of one, two or three walls of the space. When an octave band equaliser is available, satisfactory equalisation is sometimes not possible because the peaks and the dips do not exactly coincide with the location of the band filters of the equaliser.

By rendering the central frequencies of the band filters variable in accordance with the invention, it is possible to adjust the filter bands along the frequency axis towards higher or lower frequencies until the bands correspond to the peaks and dips in the frequency characteristic to be corrected, whereafter a satisfactory equalisation is possible. The band filters can very easily be adjusted if they are constructed as digital filters. Each filter is then provided with an associated memory for storing as many sets of filter coefficients for the digital filter as are required for the different adjustments of the filters. To this end the output of each memory is coupled to a coefficient input of the associated band filter for the supply of a set of filter coefficients to the filter under the influence of a control signal applied to control inputs of the memory and of the filter.

Since the aforementioned problem of non-coincidence of the location of the peaks and dips with the bands of the filters occurs mainly at low frequencies, the central frequencies of at least those band filters whose bands are in a low-frequency part of the frequency range will be made variable. The said low-frequency part can extend to about 1 kHz.

The aforementioned problem could also be solved in another manner, for example by providing an equaliser with filtes whose central frequencies are closer together, such as one third octave filters. A satisfactory equalisation is possible in this case. However, as compared with an equaliser with bands whose central frequencies are an octave apart, for example octave bands, three times as many filters are required, which is very expensive. Moreover, the operation of such an equaliser is much more intricate.

It may be arranged that the central frequencies of those band filters which are located in the low-frequency part of the frequency range can be shifted towards lower and higher frequencies over a maximum of half their distance from the central frequencies of neighbouring band filters. It is to be noted that this applies when the frequencies are plotted on a logarithmic scale. Preferably the central frequencies of the band filters in the non-shifted condition are at least separated over approximately the width of one octave and the central frequencies of the filters can be shifted over the width of one third octave at a maximum. It is feasible that three positions are chosen on the frequency axis for central frequency of a band, namely those positions corresponding to the central frequencies of the three one third octave bands around and/or in the relevant band.

In the digital construction this means that the memory contains three sets of filter coefficients for the three positions of the (digital) filter band on the frequency axis (in the case of an equal gain at the central frequency of the filter for the three situations).

When only the filter centre-frequencies in the low-frequency part can be shifted, there should preferably be a compatible cross-over between the characteristics of these filters and those of the filters whose (fixed) centre-frequencies lie in the remaining part. This can be realised, for example, by making the lower band limit frequency of the filter in this remaining part whose band adjoins that of the filter whose band lies in the low-frequency part and has the highest central frequency variable. This lower band limit frequency can then shift towards lower or higher frequencies if the central frequency of the filter whose band lies in the low-frequency part and has the highest central frequency shifts to lower or higher frequencies, respectively.

A further possibility, which will not be further described hereinafter, would be to fix the upper cut-off frequency of the last-mentioned band filter This means that the bandwidth of this band filter would become larger and smaller if its central frequency were shifted towards lower and higher frequencies, respectively.

If the equaliser furthermore comprises an electro-acousitc transducer unit coupled to the output for converting the electric output signal of the equaliser into an acoustic signal, detection means for detecting an acoustic signal and for generating an electric signal which is a measure of the acoustic signal, and a frequency analysing unit having a first input coupled to the input of the equaliser, a second input coupled to the output of the detection means and an output for supplying a control signal, which output is coupled to a control input of the equaliser, it can be used for automatically equalising a transfer function to be corrected. Automatic equalisers are known, for example, from British Patent Application No. GB 2,068,678A laid open to public inspection and U.S. Pat. No. 4,628,530. Such an equaliser may be characterized in that the frequency analysing unit is adapted to apply a control signal to the band filters whose bands lie in the low-frequency part for setting the gain factor in a filter and the central frequency of a filter. For this purpose the output of the frequency analysing unit may be coupled to the control inputs of the memories and the filters, if present.

The equaliser may be further characterized in that a band filter comprises a series arrangement of a first signal combination unit, a first delay means, a second digital combination unit and a second delay means, in that outputs of the two delay means are fed back to an input of the first signal combination unit and an input of the second signal combination unit, respectively, and in that the output of the second delay means is also fed back to an input of the first signal combination unit. Such a digital embodiment of a band filter may be further characterized in that the difference between the two coefficients corresponding to a first gain factor representing the loop gain in the circuit from the output of the first signal combination unit via the first delay means and the associated feedback to the first signal combination unit, and a second gain factor representing the loop gain in the circuit from the output of the second signal combination unit via the second delay means and the associated feedback to the second signal combination unit, is equal to the smallest unit in which these coefficients are expressed, and/or if the signs of the relevant coefficients are ignored, the difference between the two coefficients corresponding to a third gain factor representing the gain in the circuit from the output of the first signal combination unit via the first delay means to the input of the second signal combination unit and a fourth gain factor representing the gain in the circuit from the output of the second signal combination unit via the second delay means and the associated feedback to the input of the first signal combination unit is equal to the smallest unit in which these coefficients are expressed.

"Digital Signal Processing" by A. V. Oppenheim and R. W. Schafer, see page 170, FIG. 4.33 discloses a digital filter which has an input coupled to a series arrangement of a first signal combination unit, a first delay means, a second signal combination unit and a second delay means, the outputs of the first and second delay means being coupled via associated feedback paths to an input of the first signal combination unit and an input of the second signal combination unit, respectively, and the output of the second delay means being also fed back to an input of the first signal combination unit.

The known filter comprises a coupled pole pair structure. This means that the two coefficients which correspond to the first and the second gain factor are equal. If their sign is ignored, the same applies to the two coefficients which correspond to the third and the fourth gain factor. The representation of the coefficients as a digital number for its supply to the digital filter implies that a rounding-off is generally effected because the digital number is always expressed in a limited number of bits. It is common practice to choose these digital numbers for the first and the second gain factor and for the third and the fourth gain factor to be equal as well. Using these digital numbers, the digital filter which is obtained will therefore only give an approximation of the desired filter characteristic. A better approximation to the desired filter characteristic is obtained when, in some cases, the difference between the two coefficients corresponding to a first gain factor representing the loop gain in the circuit from the output of the first signal combination unit via the first delay means to the input of the second signal combination unit and a fourth gain factor representing the gain in the circuit from the output of the second signal combination unit via the second delay means and the associated feedback to the input of the first signal combination unit is equal to the smallest unit in which these coefficients are expressed. In fact, the foregoing impulse that in some cases the digital representation of two coefficients which are equal in the known filter now differ from each other by the value of the least significant bit.

The procedure by means of which the unequal coefficients are obtained will be described hereinafter. It is apparent from the Figure shown in the above-mentioned publication that, if the sign is ignored, every time two of the four coefficients are equal to each other. Let it be assumed that the value $a_c$ is found for the coefficients corresponding to the first and the second gain factor, which value can be represented by means of a digital number having a limited number of bits only after rounding off. Let it be assumed that the calculated value $a_c$ for the two coefficients lies between the digital number 'n' and 'n+1' where n is an integer. The coefficients $a_1$ and $a_2$ for the two gain factors can now be determined, for example, from the following Table.

|   |                                              | $a_1$ | $a_2$ |
|---|----------------------------------------------|-------|-------|
| 1 | $n \leq a_c < n + \Delta 1$                  | n     | n     |
| 2 | $n + \Delta 1 \leq a_c \leq n + \Delta 2$    | n     | n + 1 |
| 3 | $n + \Delta 2 < a_c \leq n + 1$              | n + 1 | n + 1 | wherein $\Delta 1 < \Delta 2$, for example, $\Delta 1 = 0.25$ and $\Delta 2 = 0.75$. Since the circuit is symmetrical for $a_1$ and $a_2$, $a_1$ could also have been taken to be equal to n+1 and $a_2$ could have been taken to be equal to n in the second case.

The invention will be described in greater detail with reference to the following description of the drawings.

FIG. 1 shows a first embodiment of the equaliser,

FIGS. 2a and 2b show the frequency characteristic of a band filter and two filter characteristics shifted along the frequency axis in FIG. 2a, and in FIG. 2b shows a number of frequency characteristics of a band filter at the same central frequency but with different gain factors within the filter, FIG. 3 is a Table giving central frequencies for five adjustable filters, FIG. 4 is a digital embodiment of the filter having the characteristics shown in FIG. 2, FIGS. 5a–5d show the contents of a memory associated with a digital filter with an adjustable central frequency, FIG. 6 shows a second embodiment, FIG. 7 shows the frequency characteristic of an adjustable filter included in the embodiment of FIG. 6, FIG. 8 shows two filter characteristics of filters with an adjustable lower cut-off frequency in FIGS. 8a and 8b.

Figures 4, 5A:
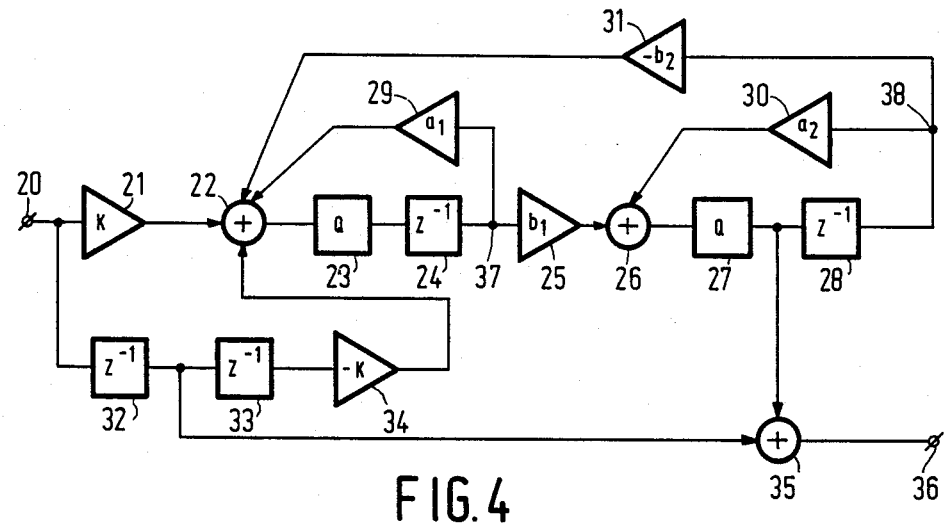
Figure 11:
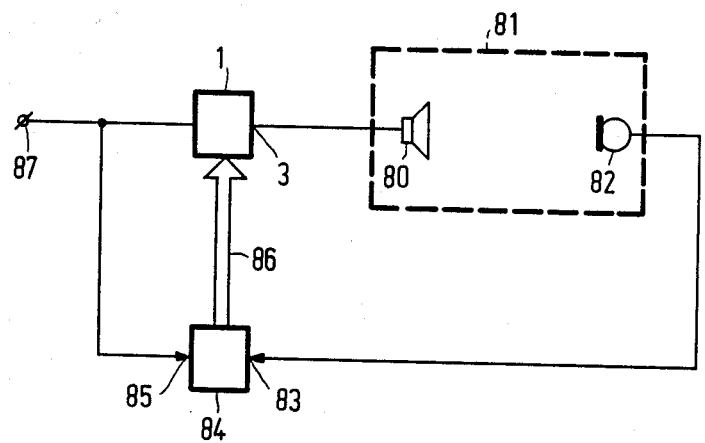
FIG. 11 shows an embodiment of an automatic equaliser.
Figure 12:
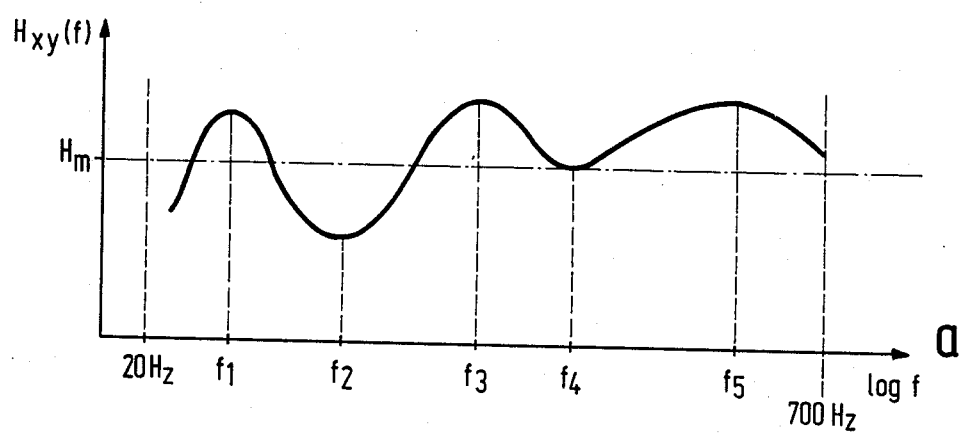
Figure 12:
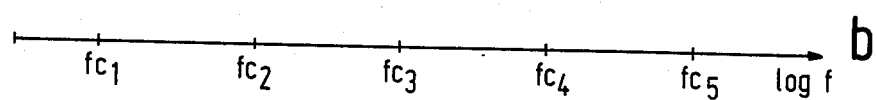
Figure 12:
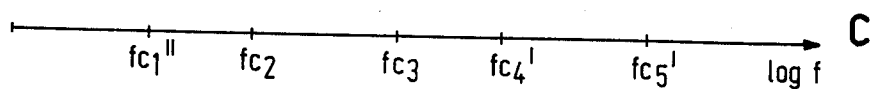
Figure 13:
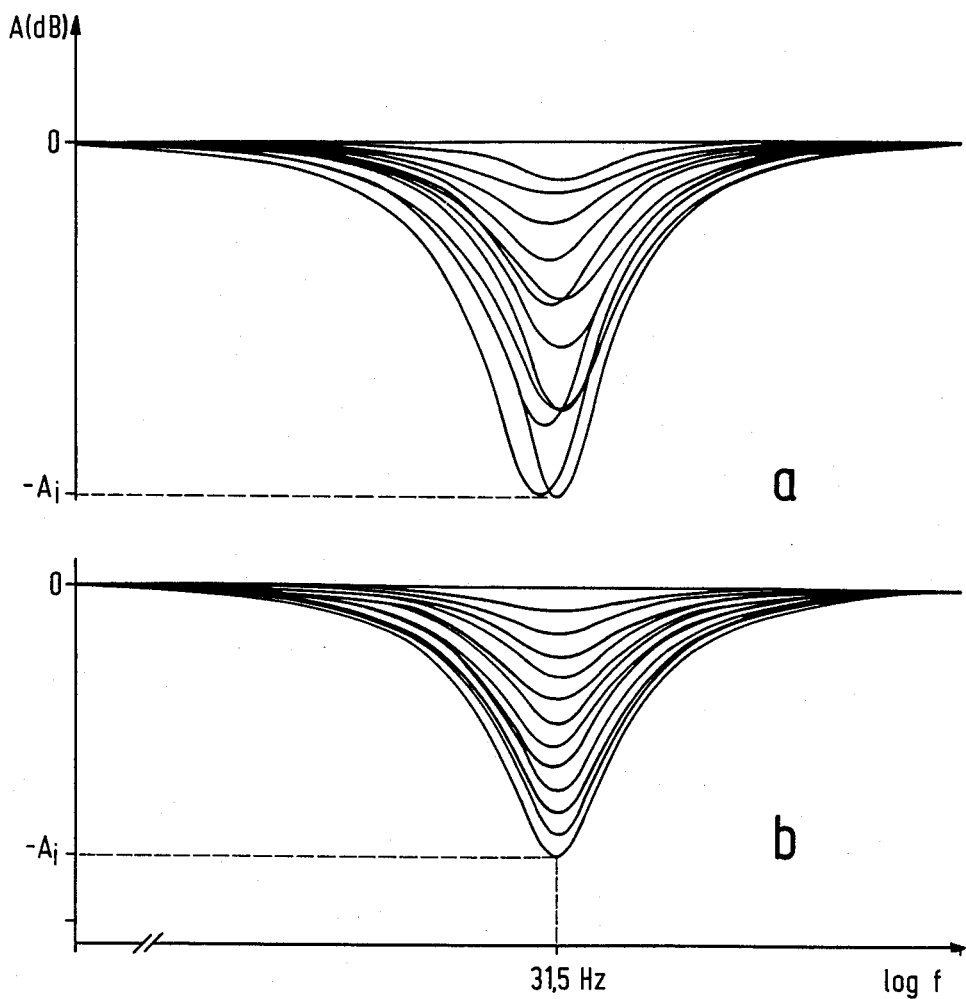

FIG. 12 shows in FIG. 12a a transfer function in the frequency analysing unit of the equaliser of FIG. 11, in FIG. 12b the location of the central frequencies of the filters whose bands lie in the low-frequency part, and in FIG. 12c the positions of the central frequencies of these filters set by the automatic equaliser, and FIG. 13 shows in FIG. 13a a number of filter characteristics of the digital filter of FIG. 4 in which the filter coefficients are obtained in accordance with the known computing method and FIG. 13b shows a number of filter characteristics with filter coefficients obtained in accordance with the new computing method.

Figures 1, 3:
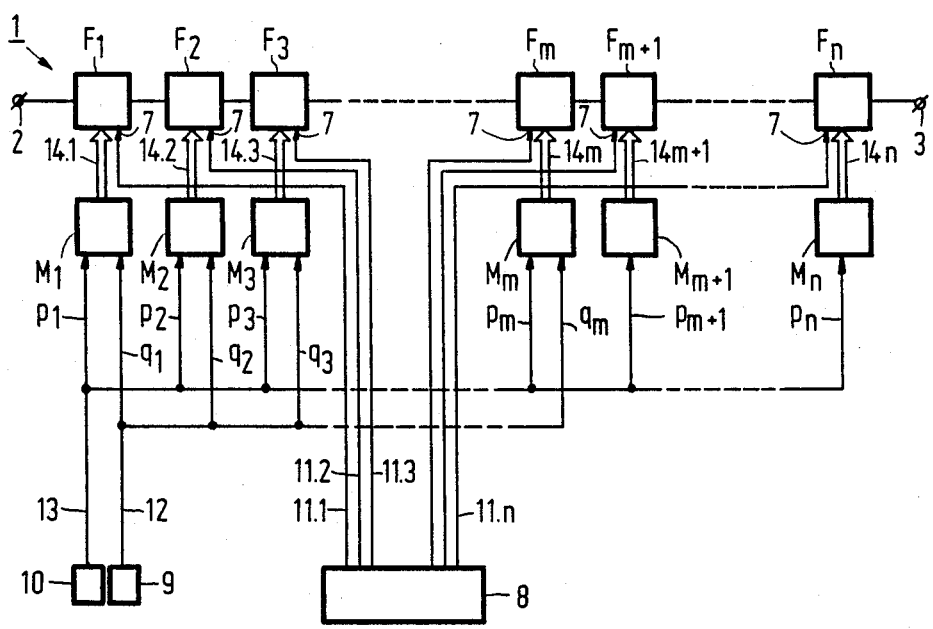

FIG. 1 shows an equaliser 1 with n series-arranged band filters $F_1$ to $F_n$ between the input 2 and the output 3. The frequency characteristic of a band filter $F_i$ is represented by the curve 3 in FIG. 2a. Outside the band the filter has a gain which is equal to $1 \times$ (0 dB). Within the band it has a gain $A_i$ (in dB!). The central frequencies of neighbouring filters $F_i$ are more than one third octave apart, for example they are one octave apart. The central frequencies $fc_i$ of the filters $F_i (1 \leq i \leq n)$ are then, for example, at 31.5; 63; 125; 250 and 500 Hz; 1, 2, 4, 8 and 16 kHz.

Figure 2A:
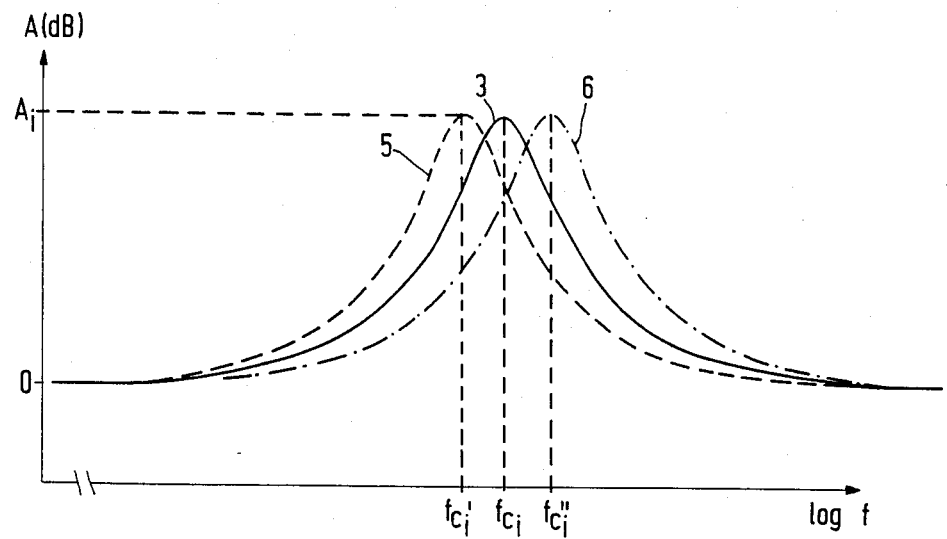

The band of filter $F_i$ (where $1 < i < m$) can be shifted towards higher and lower frequencies over a maximum of half the distance to the central frequencies of the filters having neighbouring bands. However, the shift will preferably be limited to a maximum of the width of one third octave located in the band i in question. In the embodiments of FIGS. 1 and 2a three settings of the filter $F_i$ are possible, namely the setting indicated by the curve 3; a second setting at which the filter characteristic (and hence the central frequency $fc_i$ of the filter) is shifted over the width of one third octave to lower frequencies (i.e. the curve 5 in accordance with the broken line), with the filter now having as a central frequency $fc_i'$; and a third setting at which the filter characteristic is shifted over the width of one third octave to higher frequencies (i.e. the curve 6 in accordance with the dot-and-dash line) with the filter now having $fc_i''$ as a central frequency. The values for $fc_i$, $fc_i'$ and $fc_i''$ have been shown for the filters $F_i$ having the lowest five filter bands in the Table of FIG. 3, i.e. the three positions for the central frequency of a band i, which positions exactly correspond to the central frequencies of one third octave band filters in this range. The bands of only these five filters can be shifted along the frequency axis. This means that $m = 5$.

The bandwidth of the filters $F_i$ can be freely chosen but it should have the width of one third octave as a minimum. The width is preferably not taken to be larger than the width of one octave.

Figure 2B:
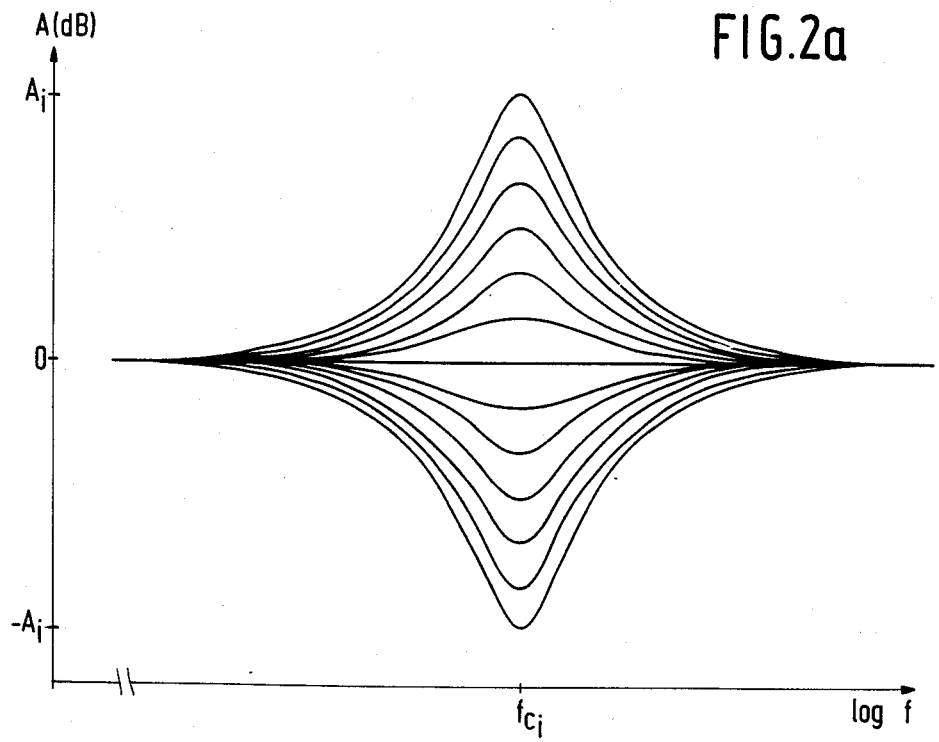

For all filters $F_i$ it holds that the gain A is adjustable within the band. This is shown in FIG. 2b for the filter $F_i$. The gain A is adjustable in a number of steps of, for example, 2 dB, between a gain of 0 (dB) i.e. a gain of $1 \times$ and a gain of $A_i$ (dB). The filter may also attenuate and is adjustable between an attenuation of 0 (dB) and $A_i$ (dB) in the same number of series of 2 dB. For $A_i = 12$ dB FIG. 2b thus comprises thirteen filter curves.

The shifts of the characteristics of the filters $F_1$ up to and including $F_m$ along the frequency axis are controlled by control signals $q_1$ up to and including $q_m$, respectively, and the gains/attenuations in the filters $F_1$ up to and including $F_n$ are controlled by control signals $p_1$ up to and including $p_n$, respectively. The two control signals $p_i$, $q_i$ (for $q \leq i \leq m$) and the control signal $p_i$ (for $m < i \leq n$) are/is to this end presented to the filter $F_i$.

In the case of analogue filters this signal (these signals) ensure(s) an adjustment of the gain factor of the filter (and the adjustment of a frequency-determining element, for example, a variable coil, in the filter).

In the case of digital filters the control signal $p_i$ (the control signals $p_i$, $q_i$) is (are) applied to memories $M_{m+1}$ up to and including $M_n$ (the memories $M_1$ up to and including $M_m$), each memory $M_i$ being associated with a bandpass filter $F_i$.

An embodiment of a digital filter is shown in FIG. 4, and FIG. 5 shows the contents of the memory $M_i$ associated with bandpass filter $F_i$.

FIG. 4 shows an embodiment of a digital filter with which the filter characteristic of FIG. 2 can be realised. The input 20 is coupled via an amplifier stage 21 having a gain factor of k to an input of a signal combination unit 22. The output of the signal combination unit 22 is coupled to a series arrangement of a quantiser 23, a delay means 24 denoted by $Z^{-1}$, an amplifier stage 25 having a gain factor of $b_1$, a second signal combination unit 26, a quantiser 27 and a second delay means 28. The outputs of the delay means 24 and 28 are fed back via amplifier stages 29 and 30 having gain factors of $a_1$ and $a_2$, respectively, to inputs of the first and second signal combination units 22 and 26, respectively. The output of the delay means 28 is also fed back via an amplifier stage 31 having a gain factor of $-b_2$ to an input of the signal combination unit 22. Furthermore, the input 20 is coupled via delay means 32 and 33 and an amplifier stage 34 having a gain factor of $-k$ to an input of the signal combination unit 22. Finally, the output of the delay means 32 and the output of the quantiser 27 are coupled to the output 36 via a signal combination unit 35.

All delay means in the current have the same delay time. The elements 23 and 27 are quantisers which are commonly used in digital systems for reducing the data flow of digital numbers to the desired quantity of bits. When the quantisers reduce the numbers to, for example, 24 bits, digital numbers having a length of 36 bits will be presented to the signal combination unit 26 as a result of the multiplication in, for example, the amplifier stage 25 in which the gain factor $b_1$ is represented, for example, by a 12-bit number. The quantiser 27 now reduces these 36-bit numbers to 24-bit digital numbers.

Figures 5C, 5D:
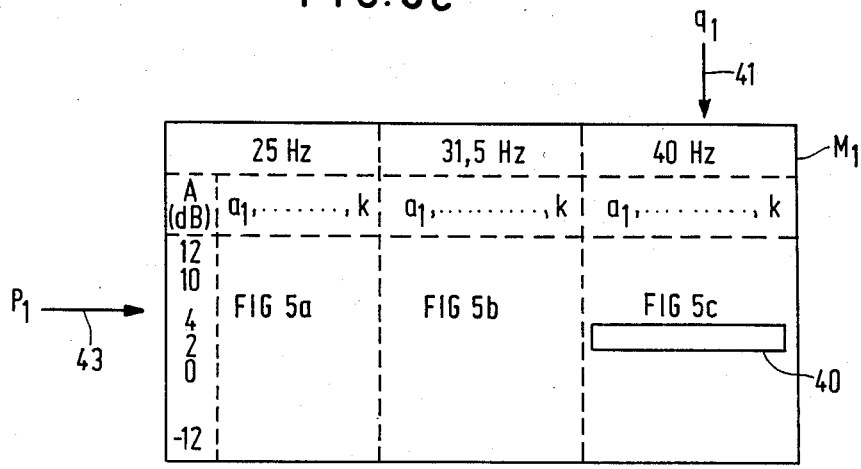

FIGS. 5a, 5b and 5c show the values of the coefficients $a_1$, $a_2$, $b_1$, $b_2$ and k corresponding again to the gain factors of the amplifier stages 29, 30, 25, 31 and 34 (the latter two having the value k), respectively, more specifically for the three central frequencies of 25 Hz, 31.5 Hz and 40 Hz and for different gains in the band. FIG. 5 actually shows the contents of the memory $M_1$. If the control signal $q_1$ is such that the characteristic of filter $F_1$ must be set at a central frequency of 40 Hz and if the control signal $p_1$ is such that a gain of 4 dB is to be realised in the band, then it is evident from FIG. 5c that $a_1=2044$, $a_2=2045$, $b_1=11$ and $k=167$. These coefficients are presented via the line 14.1 to the filter $F_1$ and, at the command of a charge pulse via the line 11.1 at the charge input 7 of filter $F_1$, they are stored in the filter so that the desired gain factors are set in the amplifier stages of the circuit of FIG. 4.

FIG. 5d diagrammatically shows the memory $M_1$ with three times thirteen sets of coefficients. The control signal $q_1$ selects that part of the memory $M_1$ which is associated with a given central frequency, i.e. the right-hand part in the afore-described example (see the arrow 41 which indicates that the control signal $q_1$ selects the part associated with 40 Hz). Subsequently the control signal $p_1$ selects the set of coefficients from the relevant part, which set is associated with a gain factor of 4 dB in accordance with the aforementioned example. This set of coefficients is diagrammatically denoted by means of the block 40. The arrow 43 indicates that the control signal $p_1$ selects the 4 dB gain.

The memories $M_2$ to $M_m$ similarly contain the coefficients for the different amplifier stages in the filters $F_2$ to $F_m$. The memories $M_{m+1}$ to $M_n$ are smaller because they only need to contain the coefficients for one central frequency. This means that they only contain the 13 sets of coefficients associated with the central frequency $fc_i$ as is shown, for example, in FIG. 5b.

The filter described in FIG. 4 is known in the art. The coefficients $a_1$, $a_2$ can be calculated for a desired filter characteristic and are basically equal. The same applies to the coefficients $b_1$, $b_2$. This is because the circuit is symmetrical for $a_1$ and $a_2$, and $b_1$ and $b_2$, respectively. When the coefficients are to be subsequently represented digitally, they can be rounded off in the normal manner so that the digital representations of the coefficients $a_1$ and $a_2$ and $b_1$, $b_2$, respectively, are equal again.

However, FIG. 5 shows that in some cases $a_1$ and $a_2$ or $b_1$ and $b_2$ are not equal. The reason is that in these cases the filter characteristic thus obtained approximates the desired filter characteristic better than in the case when $a_1$ and $a_2$ are equal and when $b_1$ and $b_2$ are equal.

Three situations will be described hereinafter:

1. In the first situation a calculation has shown, for example, that the coefficients a are both 2045.2. This value is below 2045.25. In this case the value 2045 is taken for both $a_1$ and $a_2$ (see FIG. 5a at the gain of −4 dB and −2 dB).

2. In a second situation the calculation has shown, for example, that the coefficients a are both 2045.8. This value is above 2045.75. In this case the value 2046 is taken for both $a_1$ and $a_2$ (see FIG. 5a at the gain of +4 dB and +6 dB).

3. In a third situation the calculation has given, for example, the value 2045.6. This value is between 2045.25 and 2045.75. In this case $a_1$ is taken to be equal to 2045 and $a_2$ is 2046 (see FIG. 5a at the gain of 0 and 2 dB).

Note. Instead, $a_1$ could have been taken to be 2046 and $a_2$ could have been taken to be 2045. At the gain of 2 dB in FIG. 5a a different value for k would then have been obtained. The above described situations likewise apply to the coefficients $b_1$ and $b_2$.

The result is that the first two cases yield a band filter which is known in the art. In the last case a novel band filter is obtained realising a better approximation of the desired filter characteristic. The characteristic feature of this filter is that the coefficients $a_1$ and $a_2$ and/or the coefficients $b_1$ and $b_2$ differ from each other by the value of 1× the least significant bit.

FIGS. 13a and b show the different filter characteristics obtained by means of the known calculation method (FIG. 13a—the coefficients $a_1$ and $a_2$ are equal to each other and the coefficients $b_1$ and $b_2$ are equal to each other) and by means of the calculation method as described hereinbefore (FIG. 13b in which for some sets of coefficients $a_1$, $a_2$, $b_1$, $b_2$ these coefficients $a_1$ and $a_2$ or $b_1$ and $b_2$ differ from each other by the least significant bit). This relates to the wish to realise filter characteristics at a central frequency of 31.5 Hz with negative gain factors varying in steps of 1 dB from 0 dB to $(-A_i=)-12$ dB. The filters thus attenuate to a greater or lesser extent within the band. For the purpose of clarification the vertical axis in FIG. 13a is slightly extended so that the variation of the characteristic curves in this Figure is more clearly visible. It is clear that the filter characteristics of FIG. 13b show a much greater resemblance to those of FIG. 2b than do the filter characteristics of FIG. 13a.

The amplifier stage 29 in the circuit of FIG. 4 may be disposed in the circuit from the input of the signal combination unit 22 to the tapping point 37 for the feedback to the signal combination unit 22. If this is so, the gain factor $a_1$ still determines the gain in the circuit from the output of the first signal combination unit 22 via the delay means 24 and the associated feedback to the first signal combination unit 22. However, the gain factor for the amplifier stage 25 will then have to be changed to the value $b_1/a_1$, in order that the gain in the circuit from the output of the first signal combination unit 22 via the delay means 24 to the input of the second signal combination unit 26 remains equal to $b_1$. Another possibility is to dispose the amplifier stage 25 between the output of the signal combination unit 22 and the tapping point 37. In that case the gain factor of the amplifier stage 29 will have to be modified to $a_1/b_1$ in order that the gain factor from the output of the signal combination unit 22 via the delay means 24 and the associated feedback to the first signal combination unit 22 remains equal to $a_1$. Similar considerations apply to a displacement of the amplifier stage 30 or the amplifier stage 31 to within the circuit from the output of the signal combination unit 26 via the delay means 28 to the tapping point 38.

To set the band filters $F_1$ to $F_n$, a selection circuit 8 is provided which is coupled via the leads 11.1 to 11.n to charge inputs 7 of the respective band filters $F_1$ to $F_n$. Via the leads 11.1 to 11.n one or more band filters can be selected for setting. The unit 9 supplies the control signals $q_1$ to $q_m$ via the lead 12 for setting the central frequencies of the filters $F_1$ to $F_m$ and the unit 10 supplies the control signals $p_1$ to $p_n$ via the lead 13 for setting the gain factors in the band filters $F_1$ to $F_n$. The control signals $p_i$ (and $q_i$ for $1 \leq i \leq m$) select an address in the memories $M_1$ to $M_n$. The coefficients for the relevant setting of the digital filter are stored at this address in the memory, which coefficients are presented to the filters via the leads 14.1 to 14.n. A selection or change signal presented via the charge inputs 7 to one or more of the filters then ensures that the new coefficients are stored in the filter, so that the filter is set again.

The equaliser 1 of FIG. 1 is an example of a manually adjustable equaliser. The selection circuit 8 and the units 9 and 10 then have knobs (not shown) by means of which the selection of the filter, the setting of the central frequency of the filter and the setting of the gain factor of the filter can be adjusted.

Figure 6:
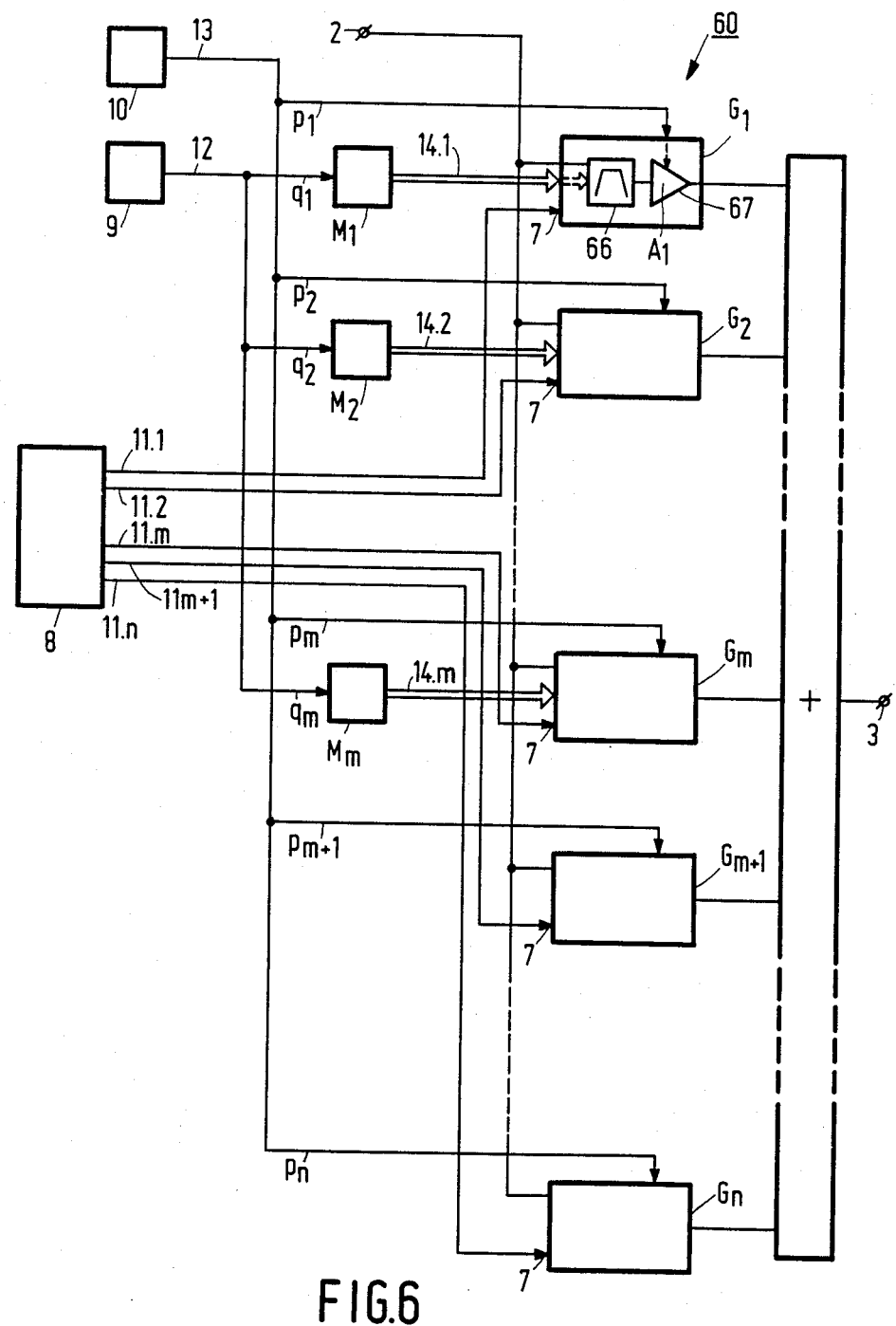
Figure 7:
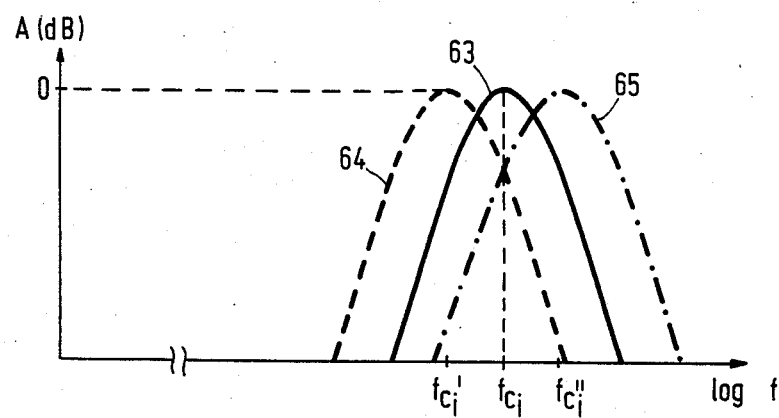

FIG. 6 shows an equaliser 60 with n parallel-arranged band filters $G_1$ to $G_n$ between the input 2 and the output 3. The outputs of the filters are coupled to the output 3 via an adder circuit 61. The frequency characteristic of a band filter $G_i$ is denoted by the curve 63 in FIG. 7. Outside the band the filter has a (very) large attenuation (that is to say, the gain factor of the filter is (very) much smaller than one there). Within the band the filter has a gain of roughly 1×. The distances between the central frequencies of neighbouring band filters is larger than one third octave again. The central frequencies of the filters $G_i$ in the embodiment of FIG. 6 are, for example, one octave apart again. The filters $G_1$ to $G_m$ are each adjustable at three positions on the frequency axis again, as is apparent from FIG. 7. The filter characteristic shifted towards lower frequencies over one third octave is denoted by the brokenline curve 64, with the central frequency $fc_i'$. The dot-and dash line 65 shows the filter characteristic shifted towards higher frequencies over one third octave, with the central frequency $fc_i''$. The value as stated in the Table of FIG. 3 can apply again to $fc_i$, $fc_i'$ and $fc_i''$. The shift of the characteristics of the filters $G_1$ to $G_m$ along the frequency axis is controlled again by the control signals $q_1$ to $q_m$ which are supplied by the unit 9 through the lead 12. The gain factor $a_i$ of a filter $G_i$ is determined by the gain factor of an amplifier which is arranged in series with the filter. This is shown in FIG. 6 (only for the filter $G_1$). All filters $G_i$ may be constructed in this manner, the element 66 itself realising the filter characteristic which can be shifted along the frequency axis and the amplifier 67 ensuring the gain factor $A_1$.

The gain factor is controlled for each filter by means of the control signals $p_1$ to $p_n$ supplied by the unit 10 and directly controlling the amplifiers in the filters (such as the amplifier 67 in filter $G_1$ via the lead 13. When the filters are constructed as digital filters, the filters $G_1$ to $G_m$ have memories $M_1$ to $M_m$ with as many sets of coefficients being stored in each memory as are required for the (three) adjustments of the filters, that is to say, three sets. The signals $q_i$ are then address signals again, which select an address in the memory $M_i$ whereafter the contents of this address in the memory are presented to the filter (such as filter 66 in $G_1$) via the leads 14.1 to 14.m. The filter coefficients for the desired setting of the filter $G_i$ are then entered (only for those filters for which $1 \leq i \leq m!$) via a charge signal which is generated by the selection circuit 8 and is presented via the lead 11.i to the change input 7 of the filter $G_i$, and the correct gain factor is set for the filter.

As will be evident, the filter coefficients of the filters $G_{m+1}$ to $G_n$ are fixed so that no memory for the storage of filter coefficients is required for these filters.

No digital embodiment is described for the band filters $G_1$ to $G_n$ because the realisation of such a digital filter, similarly to the filter $F_i$ of FIG. 1, is known to those skilled in the art.

Figure 8:
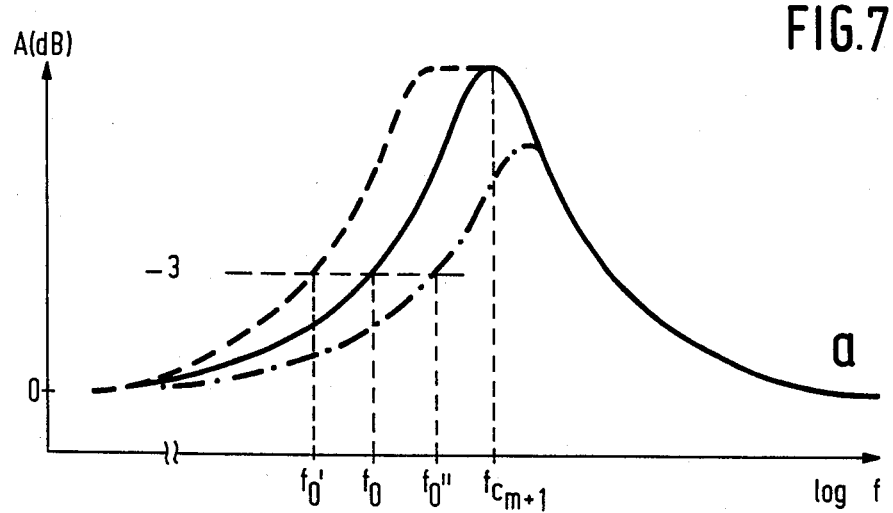
Figure 8:
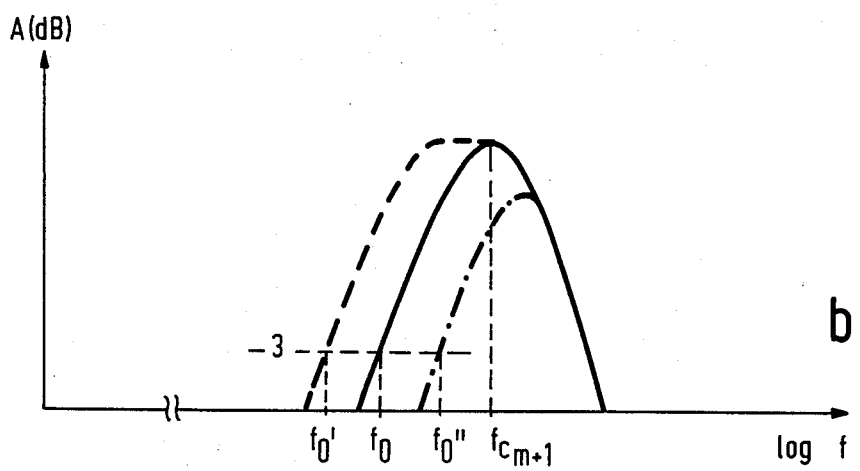

To improve the take-over between the band filters $F_m$ and $F_{m+1}$ in FIG. 1 and the band filters $G_m$ and $G_{m+1}$ in FIG. 6, the lower cut-off frequency of the filters $F_{m+1}$ and $G_{m+1}$ will preferably be made variable. This is shown in FIG. 8a for the filter $F_{m+1}$ and in FIG. 8b for the filter $G_{m+1}$. The Figures clearly show that the lower band limit frequency, being the −3 dB point at the frequency $f_0$, can be shifted towards lower frequencies, namely towards $f_0'$ and towards higher frequencies, namely towards $f_0''$ dependent on the shift of the central frequency $fc_m$ of the filters $F_m$ and $G_m$, respectively. This means for the embodiment of FIG. 1 that the memory $M_{m+1}$ will have to be extended so that three sets of filter coefficients can be stored for the three positions of the lower band limit frequency of the filter $F_{m+1}$ at a fixed degree of gain in the filter. Besides, a control signal $q_{m+1}$ (not shown in FIG. 1) must be additionally applied to the memory $M_{m+1}$. For the embodiment of FIG. 6 this means that an extra memory $M_{m+1}$ (not shown in FIG. 6) is to be added to the filter $G_{M+1}$, which memory is controlled by an additional control signal $q_{m+1}$ (likewise not shown in FIG. 6) and in which again three sets of filter coefficients are stored for the three positions of the lower band limit frequency of the filter $G_{m+1}$.

The position of the lower band limit frequency $f_0$ of the filters $F_{m+1}$ and $G_{m+1}$ may be coupled, for example, with the position of the central frequency $fc_m$ of the filters $F_m$ and $G_m$ in such a manner that in the case of a shift from $fc_m$ to $fc_m'$ (that is, a shift towards lower frequencies) $f_0$ shifts towards $f_0'$ and that in the case of a shift from $fc_m$ to $fc_m''$ (that is, a shift towards higher frequencies) $f_0$ shifts towards $f_0''$ (thus also shifts towards higher frequencies). In the two embodiments of FIGS. 1 and 6 this can be manually set by operating the selection circuit 8 and the unit 9.

Figure 9:
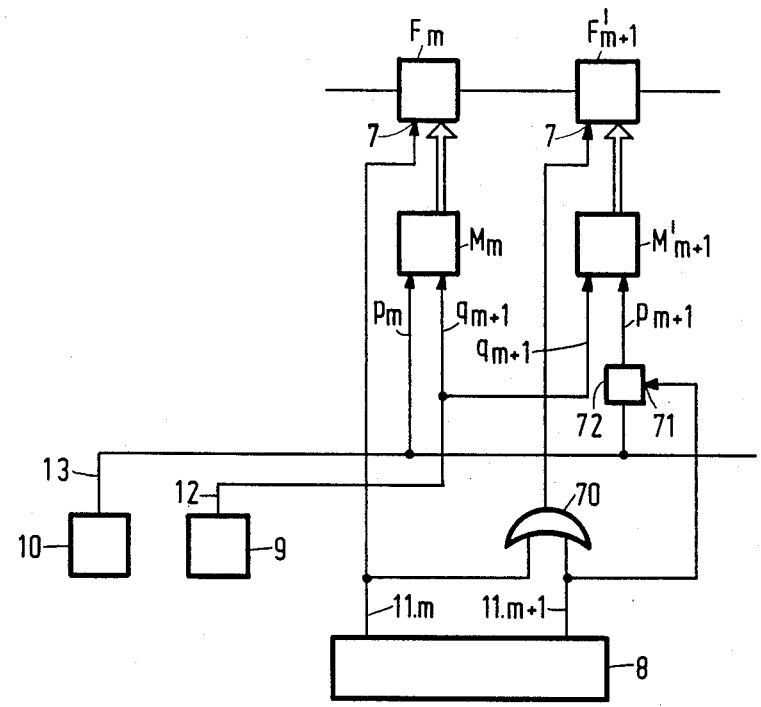
FIGS. 9 and 10 show extensions of the embodiments of FIGS. 1 and 6.
Figure 10:
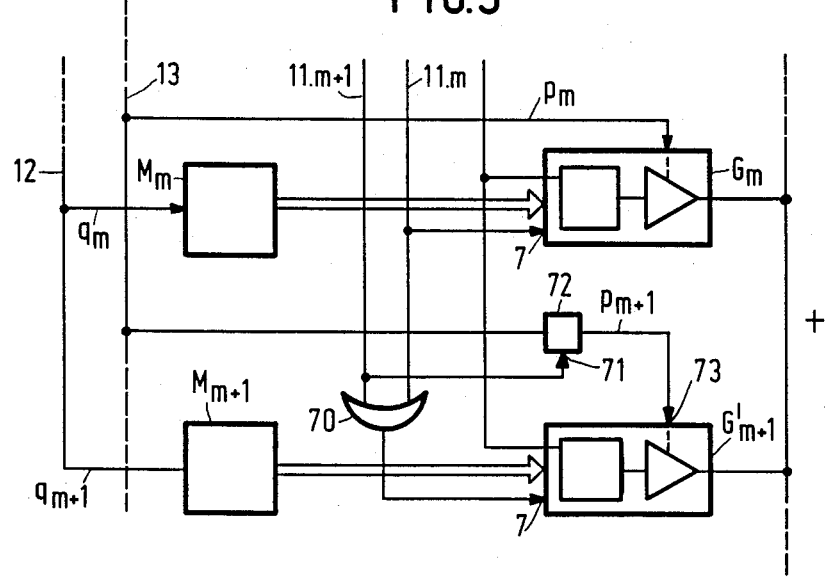

The (manual) setting of the filters $F_m$ and $G_m$ may, however, also be coupled with the setting of the filters $F_{m+1}$ and $G_{m+1}$, respectively, so that in the case of a shift of the central frequency of the filters $F_m$ and $G_m$, the lower cut-off frequency of the filters $F_{m+1}$ and $G_{m+1}$, respectively, also shifts automatically with it. This is shown in FIGS. 9 and 10. The filters in question with the variable lower band limit frequency are denoted by primed references in these Figures.

FIG. 9 shows the relevant part of the embodiment of FIG. 1. The memory associated with the band filter $F_{m+1}'$ is different in this case, as has already been explained hereinbefore, and is therefore indicated by $M_{m+1}'$. The memory $M_{m+1}'$ now has the same structure and size as the memories $M_1$ to $M_m$. In addition, this memory receives a control signal $q_{m+1}$ for addressing. Furthermore, the selection signal 11.m+1 from the selection circuit 8 of FIG. 1 is applied via an OR-gate 70 to the charge input 7 of the band filter $F_{m+1}'$. The other input of the OR-gate 70 receives the selection signal 11.m. The selection signal 11.m+1 is also applied to a charge input 71 of a memory 72 in the lead 13 from the unit 10 to one control input of the memory $M_{m+1}'$. This memory 72 serves for storage of the control signal $p_{m+1}$ for setting the gain in the filter $F_{m+1}'$. The operation of the circuit is as follows. When the filter $F_{m+1}'$ is selected via the selection circuit 8, that is to say, when a signal: logic '1' appears in the lead 11.m+1, both the lower band limit frequency of the filter $F_{m+1}'$ and the gain in the filter can be set by operating the units 9 and 10. Since the selection signal 11.m+1 is also applied to the charge input 71 of the memory 72, the control signal $p_{m+1}$ is stored in this memory 72. Setting of the filter $F_{m+1}'$ is thus possible, independent of the setting of the filter $F_m$. When subsequently the filter $F_m$ is selected, the selection signal 11.m becomes a logic '1'. The filter $F_m$ can now be arbitrarily set by operating the units 9 and 10. Since the selection signal 11.m is also presented via the OR-gate 70 to the charge input 7 of the filter $F_{m+1}'$, the lower band limit frequency $f_0$ of the filter $F_{m+1}'$ is also adjusted simultaneously with the adjustment of the central frequency $fc_m$ of the filter $F_m$, more specifically in such a manner that if $fc_m$ shifts towards $fc_m'$, $f_0$ shifts towards $f_0'$ and if $fc_m$ shifts towards $fc_m''$, $f_0$ shifts towards $f_0''$. The gain in the filter $F_{m+1}'$ then does not change because the contents of the memory 72 determining the gain factor of the filter do not change.

FIG. 10 shows the relevant part of the embodiment of FIG. 6. In this case the band filter $G_{m+1}'$ is also provided with a memory $M_{m+1}$. This memory comprises three sets of filter coefficients for the three adjustments of the lower cut-off frequency of the filter $G_{M+1}'$. Similarly to the circuit of FIG. 9, the two selection signals 11.m and 11.m+1 are also applied via an OR-gate 70 to the charge input 7 of the filter $G_{m+1}'$ and a memory 72 is present in the lead 13 from the unit 10 to the control input 73 of the filter $G_{m+1}'$ for storing the control signal $P_{m+1}$ at the command of the selection signal 11.m+1, which is presented to its charge input 71. The operation of the circuit of FIG. 10 is the same as that of FIG. 9.

The filter characteristics of FIGS. 8a and 8b can be realised by arranging a high-pass filter and a low-pass filter in series with each other, the cut-off frequency of the high-pass filter being variable and the cut-off frequency of the low-pass filter being fixed.

NO digital embodiments are described for the filters $F_{m+1}'$ and $G_{m+1}'$ because the design of such filters is also known to those skilled in the art.

FIG. 11 diagrammatically shows an automatic equaliser. For this purpose the equaliser, for example the equaliser 1 of FIG. 1, is also provided with an electroacoustic converter unit in the form of a loudspeaker 80 disposed in a space 81. Furthermore, detection means, for example, in the form of a microphone 82, which are coupled to an input 83 of a frequency analysing unit 84 are provided in the space. An input connection terminal 87 of the automatic equaliser is coupled to an input 85 of the frequency analysing unit 84.

As already mentioned hereinbefore, such circuits are generally known to equalise the acoustic signal radiated by the loudspeaker 80 into the space 81. Starting from the spectra of the signals presented to the inputs 83 and 85, a transfer function is derived in the analysing unit 84 whereafter a control signal 86 is derived by using the transfer function obtained, which control signal is applied to the equaliser 1 for setting the filters.

An extensive description of an apparatus for deriving a control signal from the transfer function as is realised in a known automatic equaliser can be found in the U.S. Pat. No. 4,628,530.

The equaliser of FIG. 11 is different in the sense that a different control signal must be derived in the frequency analysing unit for controlling the equaliser 1. Actually this means that the frequency analysing unit 84 must generate the control signals $p_1$ to $p_n$, $q_1$ to $q_m$ and the selection signals 11.1 to 11.n starting from the transfer function $H_{xy}(f)$ as obtained, for example, in the manner described in U.S. Pat. No. 4,628,530.

Generally, the method implies that in the analysing unit 84 the previously mentioned transfer function $H_{xy}(f)$ is derived in amplitude and possibly also in phase and that a control signal is derived which is applied via the lead 86 to the equaliser 1. Under the influence of this control signal the equaliser realizes a transfer function $H_{xy}-'(f)$ which is amplitude and possibly also in phase is the inverse of the transfer function $H_{xy}(f)$ as much as possible. For the digital embodiment this means that the analysing unit 84 is to supply the coefficients for the digital filters so that the total transfer function $H_{xy}-'(f)$ in amplitude and possibly also in phase can be realised as satisfactorily as possible and can be approximated as optimally as possible. This optimum approximation can be realized for example, by means of known curve-fitting techniques using, for example, a least squares errors method for obtaining the optimum approximation of the inverse of the transfer function $H_{xy}(f)$.

FIG. 12a shows an example of a transfer function $H_{xy}(f)$ obtained for a setting of the equaliser 1 which has a flat frequency characteristic. FIG. 12a only shows the amplitude transfer function in the low-frequency part of the total frequency range. The frequency analysing unit 84 has to supply such a control signal 86 to the equaliser 1 that a frequency characteristic is set in the equaliser 1 which is as much as possible the inverse of the characteristic $H_{xy}(f)$. FIG. 12b shows the location of the central frequencies $fc_1$ to $fc_5$ of the filters $F_1$ to $F_5$ present in the low-frequency part.

Generally, the transfer function in the low-frequency range, for which $20 < f < 700$ Hz, roughly comprises five significant peaks and dips. These peaks and dips are denoted by $f_1$ to $f_5$ in FIG. 12a. The frequency analysing unit 84 then supplies such a control signal 86 that the peaks and dips in $H_{xy}(f)$ coincide as much as possible with the central frequencies of the filters $F_1$ to $F_5$. This means that the frequency analysing unit applies a control signal $q_1$ to filter $F_1$ so that the central frequency shifts towards the value $fc_1''$, applies control signals $q_2$ and $q_3$ to the filters $F_2$ and $F_3$, respectively, so that the central frequencies remain in their place, and applied control signals $q_4$ and $q_5$ to the filters $F_4$ and $F_5$, respectively, so that their central frequencies shift towards the values $fc_4'$ and $fc_5'$, respectively.

Assuming that the mean value of the transfer function $H_{xy}(f)$ is at the value $H_m$, the frequency analysing unit will apply such a control signal ($p_1$, $p_3$ and $p_5$) to the filters $F_1$, $F_3$ and $F_5$ that all three of them attenuate, that is to say, they have a gain factor of less than one, while the magnitude of the attenuation of course depends on the magnitude $H_{xy}(f) - H_m$ at the frequencies $f_1$, $f_3$ and $f_5$. A control signal $p_2$ is applied to the filter $F_2$ such that it amplifies, that is to say, it has a gain factor of more than one, while the magnitude of the gain depends again on the magnitude $H_{xy} - H_{xy}(f)$ at the frequency $f_2$. The frequency analysing unit 84 will present a control signal $p_4$ to the filter $F_4$ such that a gain factor of (approximately) 1× is set.

The control for the fixed filters $F_5$ to $F_n$ is not further explained because this control can be effected in conformity with known control methods.

It is to be noted that various modifications of the embodiments shown are possible without departing from the scope of this invention as laid down in the claims.

What is claimed is:

1. An equalizer for varying the frequency characteristic of an electric signal at an input of the equalizer and for applying a frequency characteristic adapted electric signal to an output, said equalizer comprising, a plural- 1. ity of bandfilters with their frequency bands located adjacent to one another in a given frequency range, at least certain bandfilters whose frequency bands are located in a low frequency part of the frequency range having respective central frequencies which are shiftable in frequency, central frequencies of adjacent bandfilters in the non-shifted condition being spaced apart over a distance which is greater than the distance between the central frequencies of adjacent one third octave filters located at corresponding frequencies as those of the bandfilters, when in the non-shifted condition, characterized in that the central frequency of each one of said certain bandfilters can be shifted towards lower and higher frequencies over a maximum of half the distance of the said central frequency, when in the non-shifted condition, from the central frequency of the lower and higher adjacent bandfilter, respectively, when also in the non-shifted condition.

2. An equaliser as claimed in claim 1 wherein the central frequencies of the band filters in the non-shifted condition are spaced apart over substantially the width of one octave, characterized in that the central frequencies of each one of said certain bandfilters can be shifted towards lower and higher frequencies over a maximum of the width of one third octave.

3. An equaliser as claimed in claims 1 or 2, further comprising:
   an electro-acoustic transducer unit coupled to the output of converting the electric output signal of the equaliser into an acoustic signal,
   detection means for detecting an acoustic signal and for generating an electric signal which is a measure of the acoustic signal, and
   a frequency analysing unit having a first input coupled to the input of the equaliser, a second input coupled to the output of the detection means and an output for supplying a control signal, which output is coupled to a control input of the equaliser,
   characterized in that the frequency analysing unit is adapted to apply a control signal to the certain bandfilters for setting the gain factor in a bandfilter and the central frequency of a filter.

4. An equaliser as claimed in claims 1 or 2, characterized in that the bandfilters whose bands are in the remaining part of the frequency range have a fixed central frequency and in that the bandfilter in this remaining part whose band is located adjacent to that of the bandfilter whose band lies in the low-frequency part and has the highest central frequency has a lower band limit frequency which is variable.

5. An equaliser as claimed in claim 4, further comprising means for shifting the lower band limit frequency towards lower and higher frequencies if the central frequency of the filter whose band lies in the low-frequency part and has the highest central frequency, shifts towards lower and higher frequencies, respectively.

6. An equaliser as claimed in claims 1 or 2, characterized in that the band filters comprise digital filters, in that at least the certain band filters each include an associated memory for storing as many sets of filter coefficients for the digital filter as are required for different settings of the band filter, and in that an output of each memory is coupled to a coefficient input of its associated band filter for applying a set of filter coefficients to the filter under the influence of a control signal applied to control inputs of the memory and of the filter.

7. An equalizer as claimed in claim 6 further comprising:
   an electro-acoustic transducer unit coupled to the output for converting the electric output signal of the equaliser into an acoustic signal,
   detection means for detecting an acoustic signal and for generating an electric signal which is a measure of the acoustic signal, and
   a frequency analysing unit having a first input coupled to the input of the equaliser, a second input coupled to the output of the detection means and an output for supplying a control signal, said output being coupled to a control input of the equaliser,
   characterized in that the frequencies analysing unit is adapted to apply a control signal to the certain bandfilters for setting the gain factor in a bandfilter and the central frequency of a filter, and wherein the output of the frequency analysing unit is coupled to the control inputs of the memories and the filters.

8. An equaliser as claimed in claims 1 or 2, characterized in that a band filter comprises a series arrangement of a first signal combination unit, a first delay means, a second signal combination unit and a second delay means, in that outputs of the first and second delay means are fed back to an input of the first signal combination unit and an input of the second signal combination unit, respectively, and in that the output of the second delay means is also fed back to an input of the first signal combination unit.

9. An equaliser as claimed in claim 8, characterized in that the difference between two coefficients corresponding respectively to a first gain factor representing the loop gain in the circuit from the output of the first signal combination unit via the first delay means and the associated feedback to the first signal combination unit, and a second gain factor representing the loop gain in the circuit from the output of the second signal combination unit via the second delay means and the associated feedback to the second signal combination unit, is equal to the smallest unit in which these coefficients are expressed, and/or, if the sign of the two coefficients are ignored, the differences between the two coefficients corresponding to a third gain factor representing the gain in the circuit from the output of the first signal combination unit via the first delay means to the input of the second signal combination unit and a fourth gain factor representing the gain in the circuit from the output of the second signal combination unit via the second delay means and the associated feedback to the input of the first signal combination unit is equal to the smallest unit in which these coefficients are expressed.

10. A band filter comprising: an input coupled to a series arrangement of a first signal combination unit, a first delay means, a second signal combination unit and a second delay means, outputs of the first and second delay means being coupled via associated feedback paths to an input of the first signal combination unit and an input of the second signal combination unit, respectively, the output of the second delay means being also fed back to an input of the first signal combination unit, characterized in that a first coefficient corresponds to a first gain factor representing the gain in the circuit from the output of the first signal combination unit via the first delay means and the associated feedback to the first signal combination unit and a second coefficient corresponds to a second gain factor representing the gain in the circuit from the output of the second signal combination unit via the second delay means and the associated feedback to the second signal combination unit, the coefficients having a sign and, if the signs of the first and second coefficients are ignored, the difference between the first and second coefficients is equal to the smallest unit in which said coefficients are expressed.

11. A band filter as claimed in claim 10, characterized in that if calculated values for the two coefficients corresponding to the first and the second gain factor are located in a partial region which itself is located entirely within a region of values bounded by two digital numbers directly below and directly above the calculated values, then the one coefficient is equal to one of the two digital numbers and the other coefficient is equal to the other of the two digital numbers.

12. A band filter comprising: an input coupled to a series arrangement of a first signal combination unit, a first delay means, a second signal combination unit and a second delay means, outputs of the first and second delay means being coupled via associated feedback paths to an input of the first signal combination unit and an input of the second signal combination unit, respectively, the output of the second delay means being also fed back to an input of the first signal combination unit, characterized in that a first coefficient corresponds to a third gain factor ($b_1$) representing the gain in the circuit from the output of the first signal combination unit via the first delay means to the input of the second signal combination unit and a second coefficient corresponds to a fourth gain factor ($b_2$) representing the gain in the circuit from the output of the second signal combination unit via the second delay means and the associated feedback to the input of the first signal combination unit, where the coefficients each have a sign and, if the signs of the two coefficients are ignored, the difference between the two coefficients is equal to the smallest unit in which these coefficients are expressed.

13. A band filter as claimed in claim 12, characterized in that if calculated values for the two coefficients corresponding to the third and the fourth gain factor, with their signs ignored, are located in a partial region which itself is located entirely within a region of values bounded by two digital numbers directly below and directly above the calculated values, then the one coefficient is equal to one of the two digital numbers and the other coefficient is equal to the other of the two digital numbers.

* * * * *